United States Patent
Takada

(10) Patent No.: US 9,434,603 B2
(45) Date of Patent: Sep. 6, 2016

(54) PHYSICAL QUANTITY SENSOR, ELECTRONIC APPARATUS, AND MOVING OBJECT

(71) Applicant: Seiko Epson Corporation, Tokyo (JP)

(72) Inventor: Yutaka Takada, Minamiminowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/256,239

(22) Filed: Apr. 18, 2014

(65) Prior Publication Data
US 2014/0312438 A1   Oct. 23, 2014

(30) Foreign Application Priority Data

Apr. 23, 2013  (JP) ................. 2013-090231

(51) Int. Cl.
| | |
|---|---|
| *B81B 7/00* | (2006.01) |
| *B81C 1/00* | (2006.01) |
| *G01P 1/02* | (2006.01) |
| *G01P 15/08* | (2006.01) |
| *G01C 19/5628* | (2012.01) |

(52) U.S. Cl.
CPC .......... *B81B 7/0064* (2013.01); *B81C 1/00253* (2013.01); *G01C 19/5628* (2013.01); *G01P 1/023* (2013.01); *G01P 15/08* (2013.01); *B81B 2201/0235* (2013.01); *B81B 2201/0242* (2013.01)

(58) Field of Classification Search
CPC ... B81B 3/0002; B81B 7/0064; G01P 1/023; G01P 15/08; B81C 1/00253
See application file for complete search history.

(56) References Cited

U.S. PATENT DOCUMENTS

| 7,231,312 B2* | 6/2007 | Tanizawa ................. 702/130 |
| 7,692,288 B2* | 4/2010 | Zhe ................. B81C 1/0023 174/250 |
| 2012/0032286 A1* | 2/2012 | Trusov et al. ............... 257/417 |
| 2012/0074818 A1* | 3/2012 | Crowley et al. ............. 310/348 |
| 2013/0028450 A1* | 1/2013 | Cortese et al. .............. 381/174 |

FOREIGN PATENT DOCUMENTS

| JP | 03-220911 A | 9/1991 |
| JP | 2005-079694 A | 3/2005 |
| JP | 2007-174100 A | 7/2007 |
| JP | 2009-041962 A | 2/2009 |
| JP | 2009-059941 A | 3/2009 |

* cited by examiner

*Primary Examiner* — William Coleman
(74) *Attorney, Agent, or Firm* — Harness, Dickey & Pierce, P.L.C.

(57) ABSTRACT

A physical quantity sensor includes a sensor element, an integrated circuit that is electrically connected to the sensor element, and a ceramic package (base body) on which the integrated circuit is mounted. A first conductor pattern (interconnection pattern) for electrical connection with the outside is provided on one surface of the ceramic package. A second conductor pattern is provided to be electrically connected to the interconnection pattern. The second conductor pattern includes an interconnection pattern that passes through the inside of the ceramic package, and a metallized region that is exposed on the other surface of the ceramic package. The interconnection pattern is longer than a distance between the one surface and the other surface of the ceramic package.

12 Claims, 13 Drawing Sheets

PHYSICAL QUANTITY SENSOR, ELECTRONIC APPARATUS, AND MOVING OBJECT

BACKGROUND

1. Technical Field

The present invention relates to a physical quantity sensor, an electronic apparatus, and a moving object.

2. Related Art

Currently, in various systems or electronic apparatuses, physical quantity sensors, which are capable of detecting various physical quantities, such as an acceleration sensor that detects acceleration and a gyro sensor that detects an angular velocity have been widely used. Particularly, recently, an angular velocity sensor or an acceleration sensor is embedded in a portable apparatus such as a smart phone, and thus miniaturization and thickness reduction of a sensor package have become important.

As an example of a sensor package in the related art, JP-A-2009-59941 discloses an air-tightly sealed semiconductor package provided with an external electrode unit whose one end is exposed on an outer surface of an IC substrate and is electrically connected to the outside. In addition, JP-A-2009-41962 discloses a package having a structure in which the electrode unit of an IC and a sensor element is connected to an internal electrode of a ceramic package through wire bonding, and is connected to an external electrode through an interconnection inside the ceramic package. In any example, the package plays a role of protecting an internal device and of securing airtightness, and plays a role of securing electrical conduction between the inside and the outside of the package. Accordingly, in an interconnection inside a typical package, an electrical interconnection in which an interconnection resistance is set to be significantly low is demanded, and thus input and output of a signal is performed in a state in which voltage drop is small. In this manner, in a case of the interconnection structure and interconnection material in which the interconnection resistance is set to be significantly low, the voltage drop is small in an interconnection of a power supply line or a communication line, and the interconnection structure and interconnection material are suitable.

However, in a case of connecting the sensor package in the related art to an external circuit such as a microcomputer and an amplification circuit, resistance against a power supply noise and a communication noise is not expected. Therefore, in the case of the power supply line, a noise may be mixed-in to the inside of a sensor, and thus there is a possibility of causing malfunction or abnormality in function. In addition, in the case of the communication line, there is a problem in that overshoot or undershoot may occur in a signal waveform by a parasitic component that occurs due to an interconnection with an external circuit or mismatching in an impedance, thereby leading to a communication failure.

SUMMARY

An advantage of some aspects of the invention is to provide a physical quantity sensor having a package structure which is capable of improving resistance against noise from an external device or which is capable of reducing mismatching in impedance with the external device, and an electronic apparatus and a moving object which use the physical quantity sensor.

The invention can be implemented as the following forms or application examples.

APPLICATION EXAMPLE 1

This application example is directed to a physical quantity sensor including a sensor element, an integrated circuit that is electrically connected to the sensor element, and a base body on which the integrated circuit is mounted. A first conductor pattern for electrical connection with the outside is disposed on one surface of the base body. A second conductor pattern is disposed to be electrically connected to the first conductor pattern. The second conductor pattern includes a first interconnection pattern that is disposed inside the base body, and a second interconnection pattern that is disposed on the other surface of the base body. The first interconnection pattern is longer than a distance between the one surface and the other surface.

The physical quantity sensor according to this application example may be an inertial sensor such as an acceleration sensor, a gyro sensor (angular velocity sensor), and a speed sensor, or may be an inclinometer that measures an inclination angle on the basis of gravity.

According to the physical quantity sensor of this application example, since the second conductor pattern that is electrically connected to the first conductor pattern for electrical connection with the outside is longer than a conductor pattern that is formed with the shortest route (in a linear shape on an upper side) from the outside similar to the related art, a resistance value of the second conductor pattern becomes higher than that of a conductor pattern in the related art, and thus noise resistance is improved.

APPLICATION EXAMPLE 2

In the physical quantity sensor according to the application example described above, in a plan view of the base body, the first interconnection pattern may extend at least from the one end side of the integrated circuit to the other end side.

According to the physical quantity sensor of this application example, even when the width of the base body is not enlarged, the first interconnection pattern can be provided to be long, and thus it is possible to efficiently form an interconnection pattern having a high resistance value. Accordingly, it is possible to increase noise resistance or impedance matching.

APPLICATION EXAMPLE 3

In the physical quantity sensor according to the application example described above, the first interconnection pattern may include a linear shape.

According to the physical quantity sensor of this application example, it is possible to efficiently form an interconnection pattern having a high resistance value by using an inner-layer interconnection of the base body. Accordingly, it is possible to increase noise resistance or impedance matching.

APPLICATION EXAMPLE 4

In the physical quantity sensor according to the application example described above, at least a part of the first interconnection pattern may have a meandering shape.

According to the physical quantity sensor of this application example, it is possible to efficiently form an interconnection pattern having a resistance value higher than that of an interconnection pattern having a linear shape by using an inner-layer interconnection of the base body. Accordingly, it is possible to increase noise resistance or impedance matching.

APPLICATION EXAMPLE 5

In the physical quantity sensor according to the application example described above, the base body may include a first layer and a second layer. The first interconnection pattern may include a plurality of third interconnection patterns that are provided between the first layer and the second layer, a plurality of fourth interconnection patterns which are disposed at the first layer and which are provided on a side opposite to the plurality of third interconnection patterns in the first layer, and a plurality of vias that electrically connect the plurality of third interconnection patterns and the plurality of fourth interconnection patterns, respectively. The first interconnection pattern may include a meandering shape in a side view of the base body.

The first layer may be a layer on an upper side of the second layer, or a layer on a lower side of the second layer.

According to the physical quantity sensor of this application example, it is possible to efficiently form an interconnection pattern, which has a resistance value higher than that of a linear interconnection pattern that is formed in one layer, by using two layers of the base body. Accordingly, it is possible to further increase noise resistance or impedance matching.

APPLICATION EXAMPLE 6

In the physical quantity sensor according to the application example described above, the base body may include a first layer and a second layer. The first interconnection pattern may include a plurality of third interconnection patterns that are provided between the first layer and the second layer, a plurality of fourth interconnection patterns which are disposed at the first layer and which are provided on a side opposite to the plurality of third interconnection patterns in the first layer, and a plurality of vias that electrically connect the plurality of third interconnection patterns and the plurality of fourth interconnection patterns, respectively. The first interconnection pattern may include a meandering shape in a plan view of the base body.

The first layer may be a layer on an upper side of the second layer, or a layer on a lower side of the second layer.

According to the physical quantity sensor of this application example, it is possible to efficiently form an interconnection pattern, which has a resistance value higher than that of a linear interconnection pattern that is formed in one layer, by using two layers of the base body. Accordingly, it is possible to further increase noise resistance or impedance matching.

APPLICATION EXAMPLE 7

In the physical quantity sensor according to the application example described above, a part of the second conductor pattern may be constituted by a material having a sheet resistance value higher than a sheet resistance value of the first conductor pattern.

According to the physical quantity sensor of this application example, it is possible to easily form an interconnection pattern having a high resistance value without increasing a mounting area. Accordingly, it is possible to further increase noise resistance or impedance matching.

APPLICATION EXAMPLE 8

In the physical quantity sensor according to the application example described above, a third conductor pattern having a constant potential may be provided inside the base body, and the third conductor pattern may be provided at least at both sides of the first interconnection pattern.

According to the physical quantity sensor of this application example, it is possible to make the periphery of the first interconnection pattern, which constitutes the second conductor pattern, have low impedance, and thus it is possible to make noise overlapping less likely to occur in the second conductor pattern.

APPLICATION EXAMPLE 9

This application example is directed to an electronic apparatus including any of the physical quantity sensors described above.

APPLICATION EXAMPLE 10

This application example is directed to a moving object including any of the physical quantity sensors described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the attached drawings. In addition, the following embodiments are not intended to limit the content of the invention described in the appended claims. In addition, it cannot be said that the entire configurations described below are essential construction requirements of the invention.

1. Physical Quantity Sensor
1-1. First Embodiment

Figure 1:
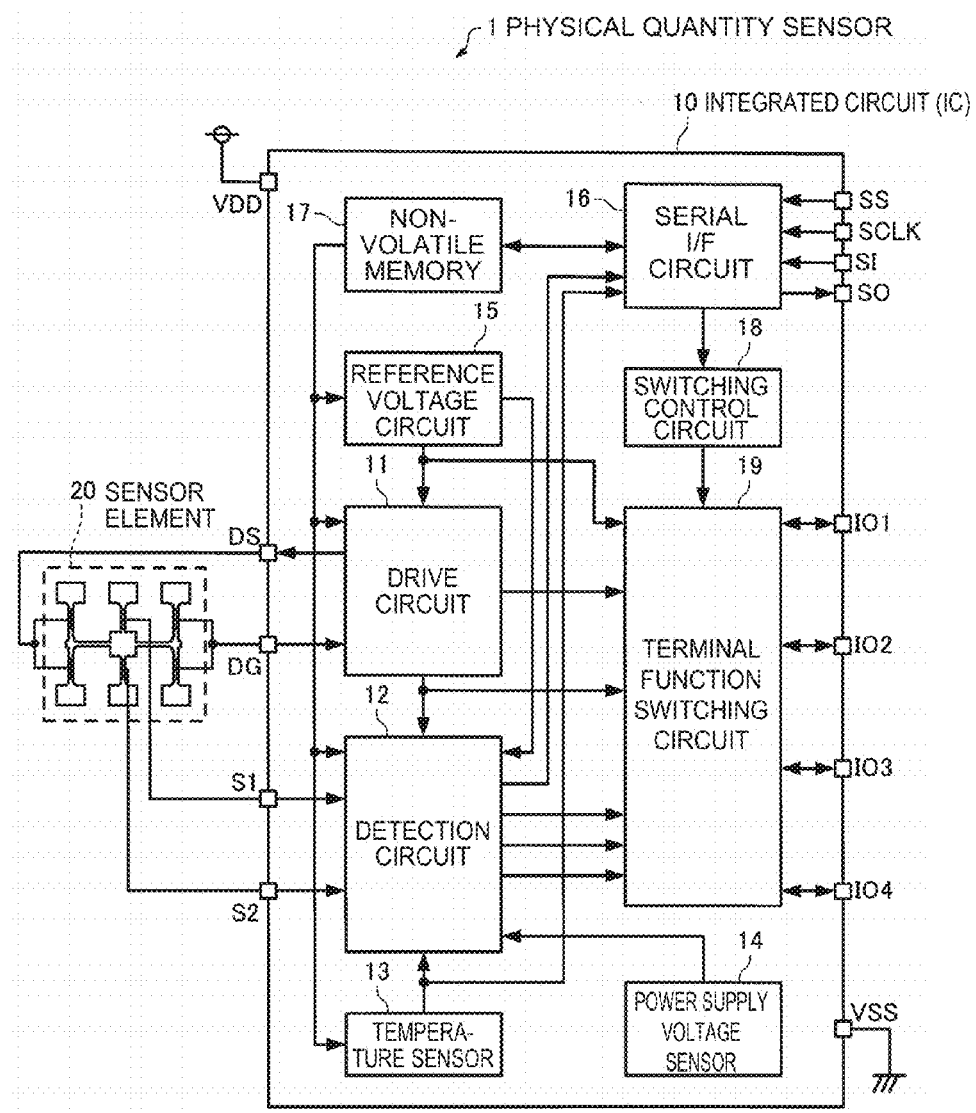
FIG. 1 is a view illustrating an example of a functional block diagram of a physical quantity sensor of this embodiment.

FIG. 1 is an example of a functional block diagram of a physical quantity sensor of this embodiment. As shown in FIG. 1, a physical quantity sensor 1 of this embodiment includes an integrated circuit (IC) 10 and a sensor element 20.

In FIG. 1, the sensor element 20 is a vibration-type piezoelectric angular velocity detection element in which two drive electrodes and two detection electrodes are formed in a so-called double T-type quartz vibrator element including two T-type drive vibrating arms and one detection vibrating arm formed between the drive vibrating arms.

When an alternating voltage signal as a drive signal is supplied to the two drive vibrating arms of the sensor element 20, the two drive vibrating arms perform flexural vibration (excitation vibration) in which distal ends approach each other and are spaced from each other in a repetitive manner due to an inverse piezoelectric effect. When amplitudes of the flexural vibration of the two drive vibrating arms are equal to each other, the two drive vibrating arms perform the flexural vibration in a linear symmetric relation with respect to the detection vibrating arm at all times, and thus the detection vibrating arm does not cause vibration.

In this state, an angular velocity in a state in which an axis perpendicular to an excitation vibrating surface of the sensor element 20 is set as a rotation axis is applied, the two drive vibrating arms obtain a Coriolis force in a direction perpendicular to both of the flexural vibration direction and the rotation axis. As a result, symmetry in the flexural vibration of the two drive vibrating arms collapses, and thus the detection vibrating arm performs flexural vibration to maintain balance. A phase difference between the flexural vibration of the detection vibrating arm and the flexural vibration (excitation vibration) of the drive vibrating arms, which accompanies the Coriolis force, is 90°. In addition, an alternating current charge of an inverse phase (phase is different by 180°), which is based on the flexural vibration, occurs at the two detection electrodes due to a piezoelectric effect. The alternating current charge varies in accordance with the magnitude of the Coriolis force (in other words, the magnitude of the angular velocity applied to the sensor element 20).

In addition, the vibrating element of the sensor element 20 may not be the double T-type. For example, the vibrating element may be a tuning fork type or a tooth type, or a tuning bar type having a shape such as a triangular prism, a quadrangular prism, and a circular column. In addition, as a material of the vibrator element of the sensor element 20, for example, a piezoelectric single crystal such as lithium tantalate ($LiTaO_3$) and lithium niobate ($LiNbO_3$) or a piezoelectric material such as piezoelectric ceramics including lead zirconate titanate (PZT) may be used, and a silicon semiconductor may be used instead of quartz ($SiO_2$). In addition, for example, the vibrator element may have a structure in which a piezoelectric thin film such as zinc oxide (ZnO) and aluminum nitride (AlN) inserted into a drive electrode is disposed on a part of a surface of the silicon semiconductor.

In addition, the sensor element 20 is not limited to the piezoelectric sensor element, and may be a sensor element of a vibration type such as an electromotive type, an electrostatic capacity type, an eddy current type, an optical type, and a strain gauge type. In addition, a type of the sensor element 20 is not limited to the vibration type, and may be, for example, an optical type, a rotation type, and a fluid type. In addition, a physical quantity that is detected by the sensor element 20 is not limited to the angular velocity, and may be angular acceleration, acceleration, a velocity, a pressure, a force, and the like.

As shown in FIG. 1, in this embodiment, the two drive electrode of the sensor element 20 are connected to a DS terminal and a DG terminal of the integrated circuit (IC) 10, respectively. In addition, the two detection electrodes of the sensor element 20 are connected to an S1 terminal and an S2 terminal of the integrated circuit (IC) 10, respectively.

The integrated circuit (IC) 10 includes a drive circuit 11, a detection circuit 12, a temperature sensor 13, a power supply voltage sensor 14, a reference voltage circuit 15, a serial interface circuit 16, a nonvolatile memory 17, a switching control circuit 18, and a terminal function switching circuit 19. In addition, the integrated circuit (IC) 10 of this embodiment may have a configuration in which parts of the elements shown in FIG. 1 are omitted or modified, or other elements are added.

The reference voltage circuit 15 generates a constant voltage or a constant current of a reference potential (analog ground voltage) and the like from a power supply voltage supplied from a VDD terminal, and supplies the constant voltage or the constant current to the drive circuit 11, the detection circuit 12, and the temperature sensor 13.

The drive circuit 11 generates a drive signal that allows the sensor element 20 to perform excitation vibration, and supplies the drive signal to one of the drive electrodes of the sensor element 20 through the DS terminal. In addition, a drive current (quartz current) that is generated in the other drive electrode by the excitation vibration of the sensor element 20 is input to the drive circuit 11 through the DG terminal, and the drive circuit 11 performs feedback control of an amplitude level of a drive signal in order for an amplitude of the drive current to be maintained constantly. In addition, the drive circuit 11 generates a signal whose phase deviates from that of the drive signal by 90°, and supplies the signal to the detection circuit 12.

Alternating current charges (detection currents) that are generated in the respective two detection electrodes of the sensor element 20 are input to the detection circuit 12 through the S1 terminal and the S2 terminal, respectively. The detection circuit 12 detects only an angular velocity component contained in the alternating current charges (detection currents) and generates a signal (angular velocity signal) of a voltage level in correspondence with the magnitude of the angular velocity. In this embodiment, the detection circuit 12 converts the detection currents input from the S1 and S2 terminals into voltages, and further performs A/D conversion by setting the signal (signal having a phase deviated from that of the drive signal by 90°) supplied from the drive circuit 11 to a sampling clock to generate a detection signal (angular velocity signal) by digital processing.

The temperature sensor 13 generates a signal in which a voltage approximately linearly varies according to a temperature variation, A/D converts this signal, and outputs the converted signal. The temperature sensor 13 may be realized by using, for example, a band gap reference circuit.

The power supply voltage sensor 14 A/D converts a power supply voltage value that is supplied from the VDD terminal and outputs the converted power supply voltage value.

The nonvolatile memory 17 stores various kinds of adjustment data or correction data with respect to the drive circuit 11, the detection circuit 12, and the temperature sensor 13. The nonvolatile memory 17 may be realized by, for example, a metal oxide nitride oxide silicon (MONOS) type memory.

In a process of generating an angular velocity signal, the detection circuit 12 performs zero-point power supply voltage correction, zero-point temperature correction, and sensitivity temperature correction of the angular velocity signal by using the digital output signal supplied from the temperature sensor 13 and the power supply voltage sensor 14, and the correction data stored in the nonvolatile memory 17.

The angular velocity signal (digital signal) generated by the detection circuit 12 is supplied to the serial interface circuit 16.

The terminal function switching circuit 19 switches a connection destination of each of four terminals IO1, IO2, IO3, and IO4. For example, the terminal function switching circuit 19 selects an output signal or an internal signal of the drive circuit 11, the detection circuit 12, and the reference voltage circuit 15 under control of the switching control circuit 18, and outputs the selected signal to the outside from any one of the IO1, IO2, IO3, and IO4. In addition, the terminal function switching circuit 19 may supply an external signal that is input from any one of the IO1, IO2, IO3, and IO4 to the drive circuit 11, the detection circuit 12, and the reference voltage circuit 15.

The switching control circuit 18 controls the switching of the connection destination of the four terminals IO1, IO2, IO3, and IO4 according to a setting value received from the serial interface circuit 16.

Figure 2:
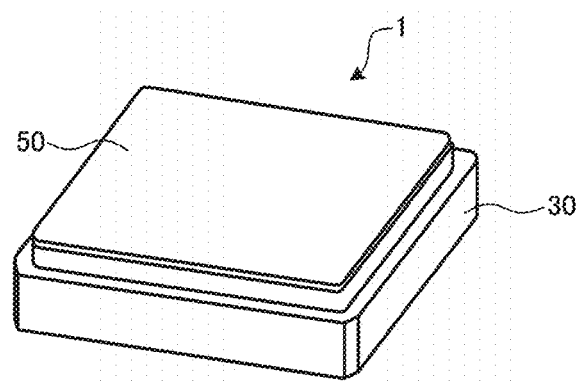
FIG. 2 is a perspective view of an external appearance (sensor package) of the physical quantity sensor of this embodiment.

The physical quantity sensor 1 of this embodiment is configured in such a manner that the integrated circuit (IC) 10 and the gyro sensor element 20 are sealed in a package. FIG. 2 is a perspective view of an external appearance (sensor package) of the physical quantity sensor 1 of this embodiment, and FIG. 3 is an exploded perspective view of the sensor package.

Figure 3:
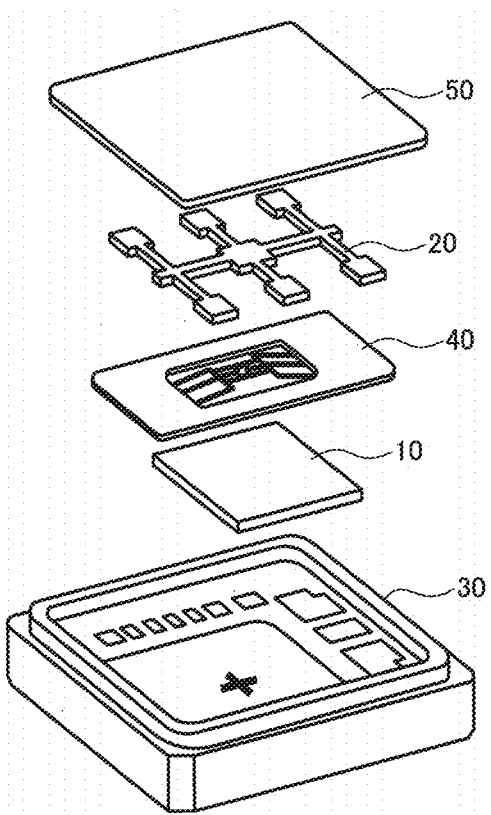
FIG. 3 is an exploded perspective view of the sensor package.

As shown in FIGS. 2 and 3, the physical quantity sensor 1 is mounted as a sensor package having the following structure. Specifically, the integrated circuit (IC) 10 is disposed at an opening of a ceramic package 30 (an example of a base body) in which a plurality of layers are laminated, a sensor element holding member 40 is disposed on an upper surface of the ceramic package 30, the sensor element 20 is held on the sensor element holding member 40 to vibrate, and a cover unit (lid) 50 is bonded to a seam ring provided on the upper surface of the ceramic package 30. The ceramic package 30 serves as casing of the integrated circuit (IC) 10 and the sensor element 20, and plays a role of electrically connecting the integrated circuit (IC) 10 and the sensor element 20 to the outside.

Figure 4:
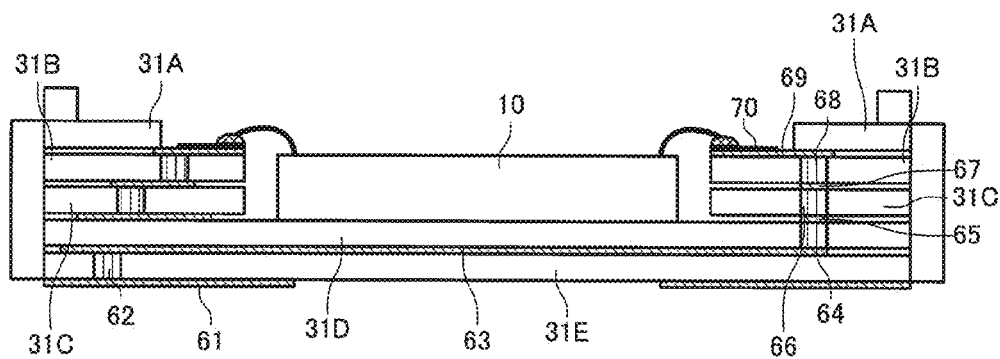
FIG. 4 is a view illustrating a longitudinal structure of a ceramic package in a first embodiment.

FIG. 4 is a view illustrating a longitudinal structure of the ceramic package 30. As shown in FIG. 4, in the ceramic package 30, for example, five ceramic substrates 31A, 31B, 31C, 31D, and 31E are laminated. For example, the thickness of the ceramic package 30 (a total of the thickness of the respective ceramic substrates 31A, 31B, 31C, 31D, and 31E) is approximately 1 mm, and the length of one side of a surface of the ceramic substrate 31E is, for example, approximately 5 mm.

A conductive interconnection pattern is formed on the surface (in this embodiment, the interconnection pattern is formed on the upper surface, but may be formed on a lower surface) of each of the ceramic substrate. Parts of the interconnection patterns that are formed on the surface of two adjacent ceramic substrates are electrically connected to each other through a via formed in a through-hole (hole). For example, the "via" may be configured in such a manner that a conductive film is provided on an inner wall of the through-hole (hole) to electrically connect a front surface side and a rear surface side of a substrate, or may be configured in such a manner that a conductive material is filled inside the through-hole (hole) to electrically connect the front surface side and the rear surface side of the substrate. An interconnection pattern (external conductor pattern), which serves as an external terminal, is formed on the lower surface (bottom surface of the ceramic package 30) of the lowermost ceramic substrate 31E. The external conductor pattern (external terminal) is soldered to a printed substrate (not shown) for electrical connection with an external device.

An opening is provided at the center of each of the ceramic substrates 31A, 31B, and 31C, and the integrated circuit (IC) 10 is disposed in the opening. A metallized region, which is metallized by a material such as gold and nickel at least at a part of the interconnection pattern, is formed on the upper surface of the ceramic substrate 31B, and the terminal (electrode) of the integrated circuit (IC) 10 and the metallized region are wire-bonded.

As described above, the external conductor pattern is electrically connected to the integrated circuit (IC) 10 through a conductor pattern (internal conductor pattern) including a plurality of the interconnection patterns formed on the surface of the ceramic substrates 31A, 31B, 31C, 31D, and 31E, and a plurality of the vias that electrically connect the plurality of interconnection patterns.

A tungsten material or a material such as silver and copper having a low sheet resistance value is used for the interconnection pattern that is formed on the surface of each of the ceramic substrate and the via. In FIG. 4, an oblique line is drawn in the interconnection pattern, and a vertical line is drawn in the via.

In this embodiment, an interconnection pattern 61 is formed on the bottom surface of the ceramic substrate 31E (bottom surface (one surface) of the ceramic package 30) and is electrically connected to an interconnection pattern 63, which extends at least from one end side to the other end side of the integrated circuit (IC) 10 on the upper surface of the ceramic substrate 31E, through a via 62. The interconnection pattern 63 is electrically connected to an interconnection pattern 65, which is formed on an upper surface of the ceramic substrate 31D, through a via 64. The interconnection pattern 65 is electrically connected to an interconnection pattern 67, which is formed on an upper surface of the ceramic substrate 31C, through a via 66. The interconnection pattern 67 is electrically connected to an interconnection pattern 69, which is formed on the upper surface of the ceramic substrate 31B, through a via 68. In addition, a metallized region 70 is provided on a part of an upper surface of the interconnection pattern 69 to be exposed on the upper surface (the other surface) of the ceramic package 30, and the metallized region 70 is wire-bonded to the terminal (electrode) of the integrated circuit (IC) 10.

That is, the interconnection pattern 61 (first conductor pattern), which is an external conductor pattern, is electrically connected to the integrated circuit (IC) 10 through an internal conductor pattern (second conductor pattern) that is constituted by the via 62, the interconnection pattern 63 (an example of the first interconnection pattern), the via 64, the interconnection pattern 65, the via 66, the interconnection pattern 67, the via 68, the interconnection pattern 69, and the metallized region 70 (an example of the second interconnection pattern). In addition, for example, the interconnection pattern 61 is connected to any one of the VDD terminal, a VSS terminal, terminals (SS, SCLK, SI, and SO) for serial communication, and the IO terminals (IO1, IO2, IO3, and IO4) of the integrated circuit (IC) 10 shown in FIG. 1.

Figure 5:
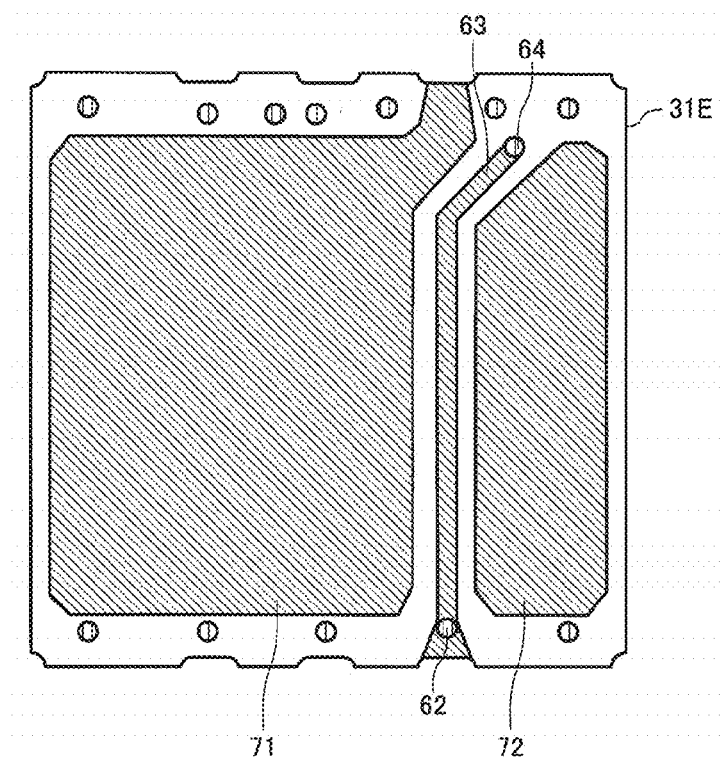
FIG. 5 is a view illustrating an example of an interconnection pattern in the first embodiment.

FIG. 5 is a view illustrating an example of the interconnection pattern 63 that is formed on the upper surface of the ceramic substrate 31E. As shown in FIG. 5, the interconnection pattern 63 in this embodiment is formed in a linear shape (approximately linear shape) on the upper surface of the ceramic substrate 31E, and is longer than the distance between the bottom surface (one surface) and the upper surface (the other surface) of the ceramic package 30, that is, the thickness of the ceramic package 30 (for example, approximately 1 mm). Accordingly, the second conductor pattern including the interconnection pattern 63 is longer than an internal conductor pattern (the length thereof is approximately equal to the thickness of a ceramic substrate) that is formed with the shortest route from an external conductor pattern (in a linear shape on an upper side) similar to the related art, and has a length that is at least approximately two or more times the length of the internal conductor pattern. Therefore, a resistance value of the second conductor pattern is set to approximately two or more times a resistance value of the internal conductor pattern in the related art. In addition, it is preferable that the interconnection pattern 63 is at least longer than a half of the length (for example, approximately 5 mm) of one side of the surface of the ceramic substrate 31E to increase the resistance value of the second conductor pattern.

In addition, for example, an internal conductor pattern (third conductor pattern), which is connected to the VSS terminal or the VDD terminal and has a constant potential, is formed in the ceramic package 30, and the interconnection pattern 63 is interposed between an interconnection pattern 71 and an interconnection pattern 72 which are parts of the third conductor pattern. Here, the constant potential may be, for example, a power supply or a ground. Accordingly, the periphery of the interconnection pattern 63 has low impedance, and thus noise overlapping is less likely to occur in the interconnection pattern 63.

Figure 6A:
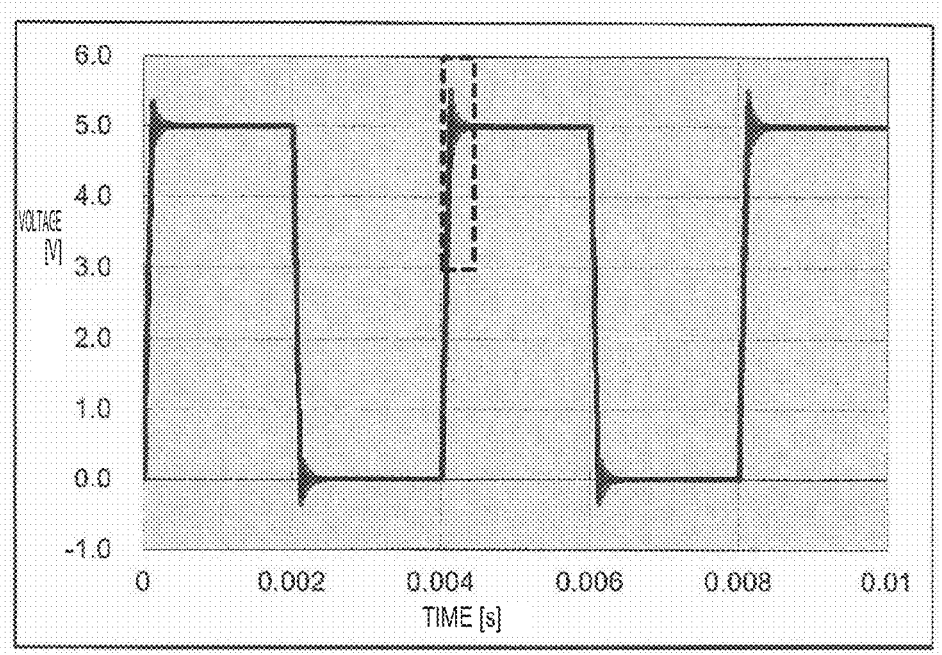
FIGS. 6A and 6B are views illustrating an example of two waveforms when a rectangular wave signal propagates through an internal conductor pattern of the related art and an internal conductor pattern of the first embodiment.
Figure 6B:
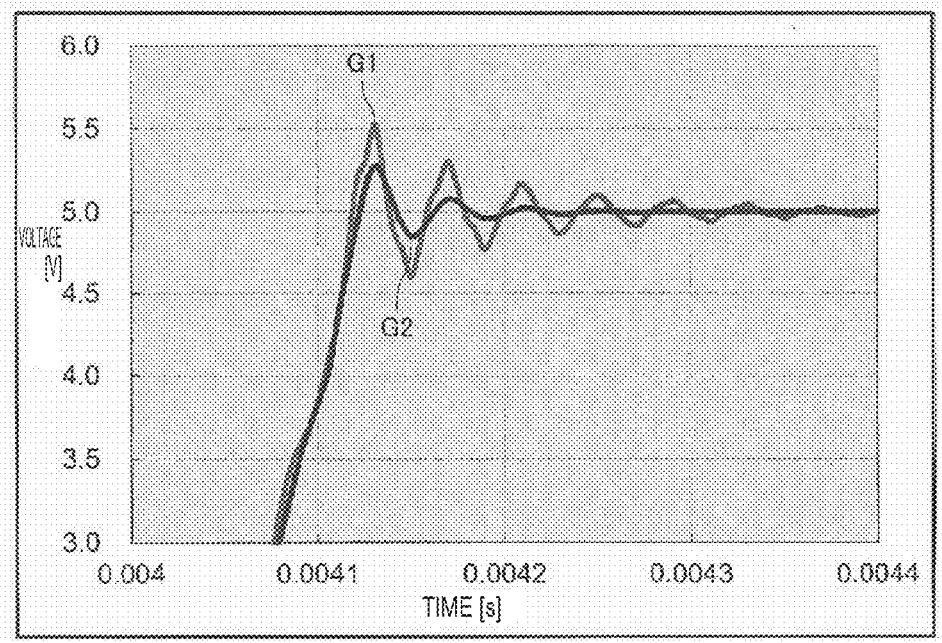

FIG. 6A is a view illustrating an example of two waveforms when the internal conductor pattern that is interconnected with the shortest length similar to the related art and the internal conductor pattern (second conductor pattern) of this embodiment are used in a communication line, and a rectangular wave signal (clock signal) propagates through the internal conductor patterns, and FIG. 6B is a view obtained by enlarging a portion surrounded by a broken line in FIG. 6A. G1 represents a waveform when the rectangular wave signal propagates through the internal conductor pattern that is interconnected with the shortest length, and G2 represents a waveform when the rectangular wave signal propagates through the internal conductor pattern (second conductor pattern) of this embodiment.

As is the case with this embodiment, in a case where an interconnection pattern having a linear shape (approximately linear shape) longer than the thickness of the ceramic package 30 is formed in one layer and thus the internal conductor pattern is made to be long, an amplitude of a ringing which occurs during rising and falling of the rectangular wave is smaller and attenuation of the ringing is larger (becomes faster) in comparison to a case where the internal conductor pattern is interconnected with the shortest length similar to the related art.

Typically, the ringing occurs when an electrical signal reciprocates on a transmission line that connects the sensor package and an external circuit (microcomputer and the like). In addition, the amplitude of overshoot or undershoot may be determined by impedance of the sensor package, characteristic impedance of the transmission line, and impedance of the external circuit. Accordingly, matching of these three kinds of impedance is effective to suppress occurrence of the ringing.

As is the case with this embodiment, when a part of the internal conductor pattern (second conductor pattern) is disposed in one layer in a linear shape (approximately linear shape), a resistance value becomes larger in comparison to a case where the interconnection conductor pattern is interconnected with the shortest length, and thus it is possible to make impedance of the sensor package 30 be close to the characteristic impedance of the transmission line and the impedance of the external circuit. In addition, an interconnection resistance thereof may suppress an increase in Q of impedance of the transmission line. That is, when the sensor package and the external circuit are connected at the transmission line, an LC resonance circuit constituted by an equivalent inductance component and an equivalent capacitance component of the transmission line is created. However, when a resistance value of the internal conductor pattern is made to be large, Q of the LC resonance circuit is suppressed, thereby quickly attenuating vibration of the ringing. That is, when a part of the internal conductor pattern is formed in one layer in a linear shape (approximately linear shape), the same effect as a case of forming a dumping resistor is obtained.

In addition, for example, when using the internal conductor pattern (second conductor pattern) of this embodiment in a power supply line, it is possible to improve noise resistance of the power supply line.

As described above, according to the physical quantity sensor of the first embodiment, since a part of at least one internal conductor pattern (second conductor pattern) that is connected to the external terminal is interconnected in a linear shape (approximately linear shape) in one layer of the ceramic package 30, it is possible to increase noise resistance. In addition, even in a case where an external circuit is connected, occurrence of ringing is suppressed and communication failure or malfunction is less, and thus it is possible to realize high reliability. In addition, it is possible to reduce noise emission from the viewpoint of electromagnetic compatibility (EMC), and thus an effect on other apparatuses or an apparatus itself can be made to be small. In addition, it is possible to obtain resistance to a certain degree at which malfunction does not occur with respect to strong electromagnetic wave noise from the outside.

In addition, according to the physical quantity sensor of the first embodiment, since the inner-layer interconnection of the ceramic package 30 is used, it is possible to realize an interconnection pattern at the low cost without using an external mounting component while not increasing a mounting area.

1-2. Second Embodiment

Figure 7:
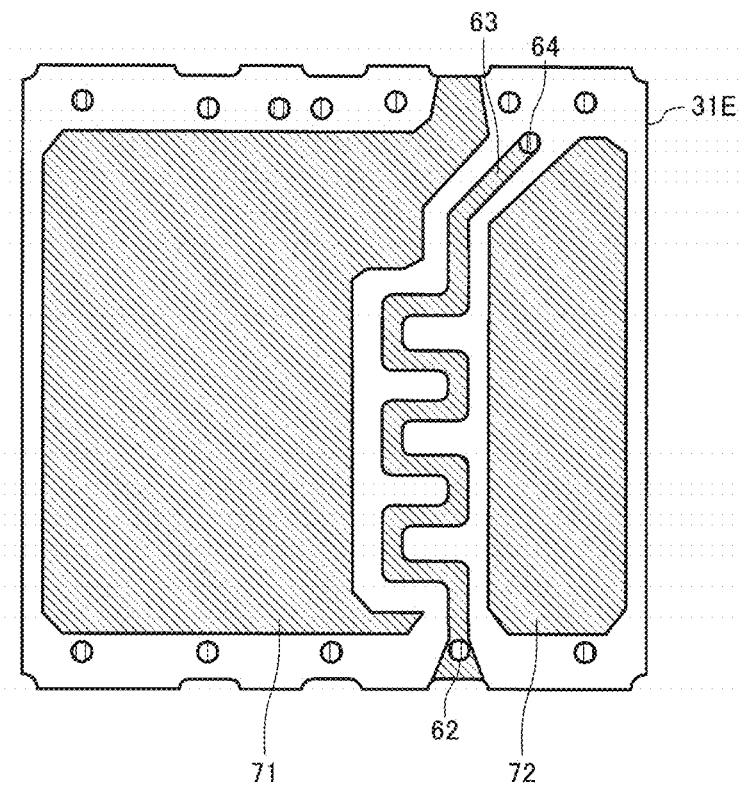
FIG. 7 is a view illustrating an example of an interconnection pattern in a second embodiment.

A physical quantity sensor of a second embodiment is different from the physical quantity sensor of the first embodiment in the shape of the interconnection pattern 63 that extends at least from one end side of the integrated circuit (IC) 10 to the other end side on the upper surface of the ceramic substrate 31E. FIG. 7 is a view illustrating an example of the interconnection pattern 63 in the second embodiment. As shown in FIG. 7, a part of the interconnection pattern 63 (an example of the first interconnection pattern) of the second embodiment is formed in a meandering shape (zigzag shape) on the upper surface of the ceramic substrate 31E, and the interconnection pattern 63 of the second embodiment is longer than the interconnection pattern 63 of the first embodiment. Accordingly, the second conductor pattern including the interconnection pattern 63 is longer than an internal conductor pattern (the length thereof is approximately equal to the thickness of a ceramic substrate) that is formed with the shortest route from an external conductor pattern (in a linear shape on an upper side) similar to the related art, and has a length that is at least approximately two or more times the length of the internal conductor pattern. Therefore, a resistance value of the second conductor pattern is set to approximately two or more times a resistance value of the internal conductor pattern in the related art. In addition, it is preferable that the interconnection pattern 63 be at least longer than a half of the length (for example, approximately 5 mm) of one side of the surface of the ceramic substrate 31E to increase a resistance value of the second conductor pattern.

In addition, as is the case with the first embodiment, the interconnection pattern 63 in the second embodiment is interposed between the interconnection pattern 71 and the interconnection pattern 72 which are parts of the third conductor pattern and have a constant potential. Accordingly, the periphery of the interconnection pattern 63 has low impedance, and thus noise overlapping is less likely to occur in the interconnection pattern 63.

In addition, the other configurations of the physical quantity sensor 1 of the second embodiment are the same as those of the first embodiment, and thus a description thereof will not be repeated.

Figure 8A:
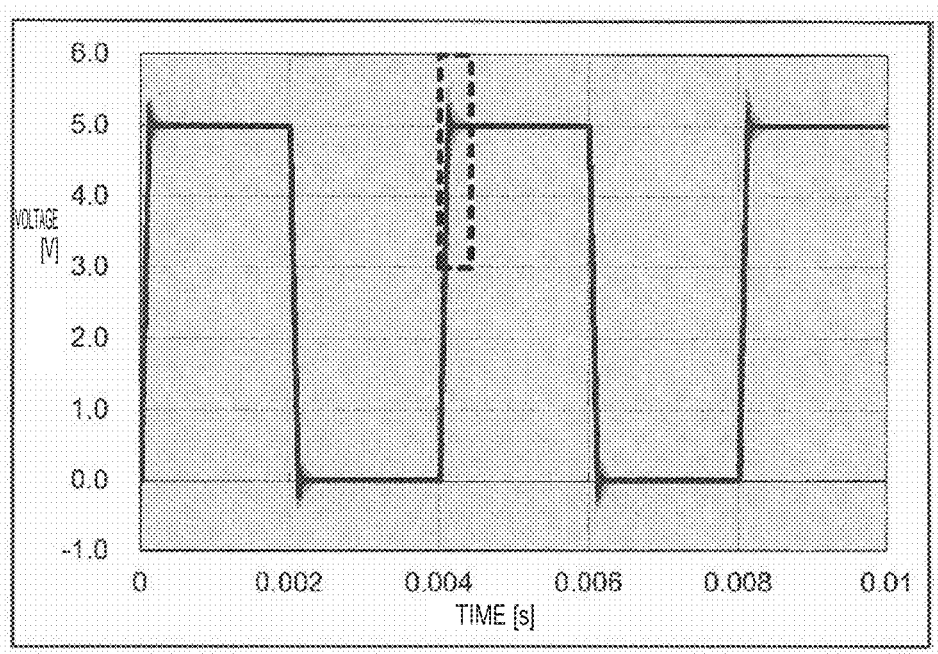
FIGS. 8A to 8B are views illustrating an example of two waveforms when a rectangular wave signal propagates through the internal conductor pattern of the related art, the internal conductor pattern of the first embodiment, and an internal conductor pattern of the second embodiment.
Figure 8B:
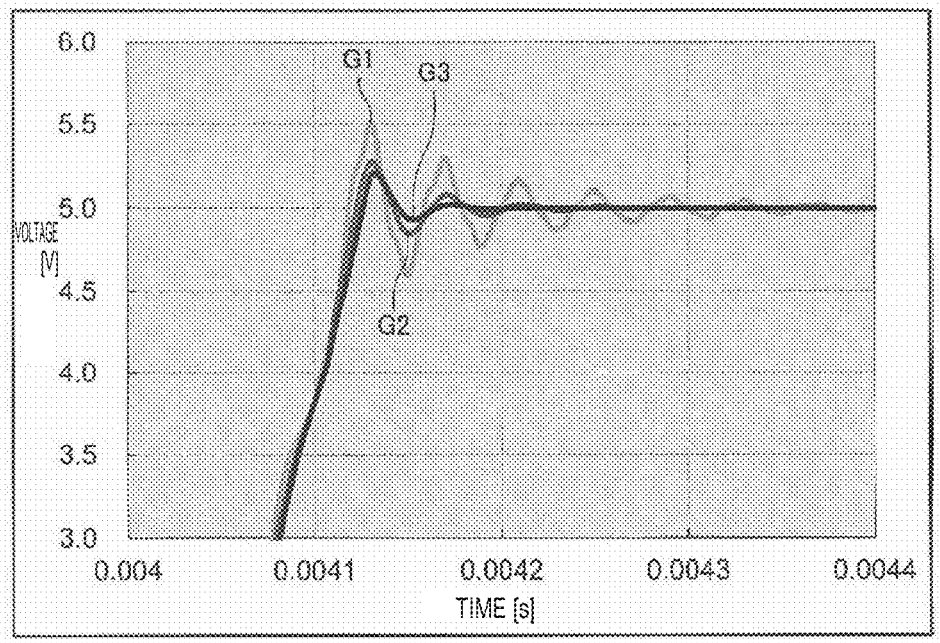

FIG. 8A is a view illustrating an example of two waveforms when the internal conductor pattern that is interconnected with the shortest length similar to the related art, the internal conductor pattern (second conductor pattern) in the first embodiment, and the internal conductor pattern (second conductor pattern) in the second embodiment are used in a communication line, and a rectangular wave signal (clock signal) propagates through the internal conductor patterns, and FIG. 8B is a view obtained by enlarging a portion surrounded by a broken line in FIG. 8A. G1 represents a waveform when the rectangular wave signal propagates through the internal conductor pattern that is interconnected with the shortest length, G2 represents a waveform when the rectangular wave signal propagates through the internal conductor pattern (second conductor pattern) of the first embodiment, and G3 represents a waveform when the rectangular wave signal propagates through the internal conductor pattern (second conductor pattern) of the second embodiment.

As is the case with the second embodiment, in a case where an interconnection pattern which is longer than the thickness of the ceramic package 30 and a part of which has a meandering shape (zigzag shape) is formed in one layer, and thus the internal conductor pattern is made to be long, an amplitude of a ringing which occurs during rising and falling of the rectangular wave is smaller and attenuation of the ringing is larger (becomes faster) in comparison to a case where the internal conductor pattern is interconnected with the shortest length similar to the related art or a case where a part of the internal conductor pattern is formed in one layer in a linear shape (approximately linear shape) similar to the first embodiment.

As is the case with the second embodiment, when a part of the internal conductor pattern (second conductor pattern) is formed to be disposed in one layer in a meandering shape (zigzag shape), a resistance value becomes larger in comparison to a case where the interconnection conductor pattern is interconnected with the shortest length, and thus it is possible to make impedance of the sensor package 30 be close to the characteristic impedance of the transmission line and the impedance of the external circuit. In addition, an interconnection resistance thereof may suppress an increase in Q of impedance of the transmission line, thereby quickly attenuating vibration of the ringing.

In addition, for example, when using the internal conductor pattern (second conductor pattern) of the second embodiment in a power supply line, it is possible to further improve noise resistance of the power supply line.

As described above, according to the physical quantity sensor of the second embodiment, since a part of at least one internal conductor pattern (second conductor pattern) that is connected to the external terminal is interconnected in a meandering shape (zigzag shape) in one layer of the ceramic package 30, it is possible to increase noise resistance. In addition, even in a case where an external circuit is connected, occurrence of ringing is suppressed and communication failure or malfunction is less, and thus it is possible to realize high reliability. In addition, it is possible to reduce noise emission from the viewpoint of electromagnetic compatibility (EMC), and thus an effect on other apparatuses or an apparatus itself can be made to be small. In addition, it is possible to obtain resistance to a certain degree at which malfunction does not occur with respect to strong electromagnetic wave noise from the outside.

In addition, according to the physical quantity sensor of the second embodiment, since the inner-layer interconnection of the ceramic package 30 is used, it is possible to realize an interconnection pattern at the low cost without using an external mounting component while not increasing a mounting area.

1-3. Third Embodiment

A physical quantity sensor of a third embodiment is different from the physical quantity sensor of the first embodiment in that the second conductor pattern includes a plurality of interconnection patterns that are formed on the surface of a plurality of layers and a plurality of vias that electrically connect the plurality of interconnection patterns instead of the interconnection pattern 63.

Figure 9:
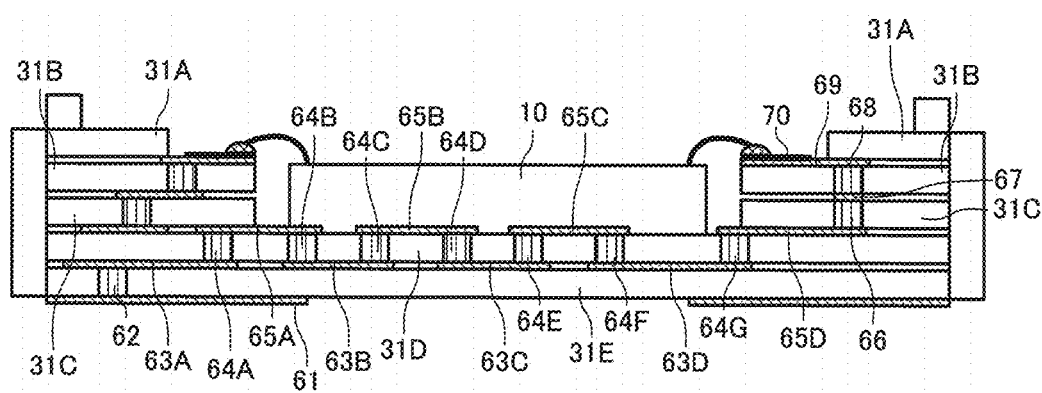
FIG. 9 is a view illustrating a longitudinal structure of a ceramic package in a third embodiment.

FIG. 9 is a view illustrating a longitudinal structure of a ceramic package 30 in the third embodiment. As shown in FIG. 9, in the third embodiment, an interconnection pattern 61 that is formed on a lower surface (bottom surface of the ceramic package 30) of a ceramic substrate 31E is electrically connected to an interconnection pattern 63A that is formed on an upper surface of a ceramic substrate 31E through a via 62. The interconnection pattern 63A is electrically connected to an interconnection pattern 65A that is formed on an upper surface of a ceramic substrate 31D through a via 64A. The interconnection pattern 65A is electrically connected to an interconnection pattern 63B that is formed on the upper surface of the ceramic substrate 31E through a via 64B. The interconnection pattern 63B is electrically connected to an interconnection pattern 65B that is formed on the upper surface of the ceramic substrate 31D through a via 64C. The interconnection pattern 65B is electrically connected to an interconnection pattern 63C that is formed on the upper surface of the ceramic substrate 31E through a via 64D. The interconnection pattern 63C is electrically connected to an interconnection pattern 65C that is formed on the upper surface of the ceramic substrate 31D through a via 64E. The interconnection pattern 65C is electrically connected to an interconnection pattern 63D that is formed on the upper surface of the ceramic substrate 31E through a via 64F. The interconnection pattern 63D is electrically connected to an interconnection pattern 65D that is formed on the upper surface of the ceramic substrate 31D through a via 64G. The interconnection pattern 65D is electrically connected to an interconnection pattern 67 that is formed on an upper surface of a ceramic substrate 31C through a via 66. The interconnection pattern 67 is electrically connected to an interconnection pattern 69 that is formed on an upper surface of a ceramic substrate 31B through a via 68. A metallized region 70 is provided on a part of an upper surface of the interconnection pattern 69, and the metallized region 70 is wire-bonded to the terminal (electrode) of the integrated circuit (IC) 10.

That is, the interconnection pattern 61 (first conductor pattern), which is an external conductor pattern, is electrically connected to the integrated circuit (IC) 10 through an internal conductor pattern (second conductor pattern) that is constituted by the via 62, the interconnection patterns 63A to 63D, the vias 64A to 64G, the interconnection patterns 65A to 65D, the via 66, the interconnection pattern 67, the via 68, the interconnection pattern 69, and the metallized region 70. In addition, as shown in FIG. 9, at least apart of the second conductor pattern is formed in a meandering shape when viewed from a side surface of the ceramic package (when viewed from a direction parallel with the bottom surface).

Figure 10A:
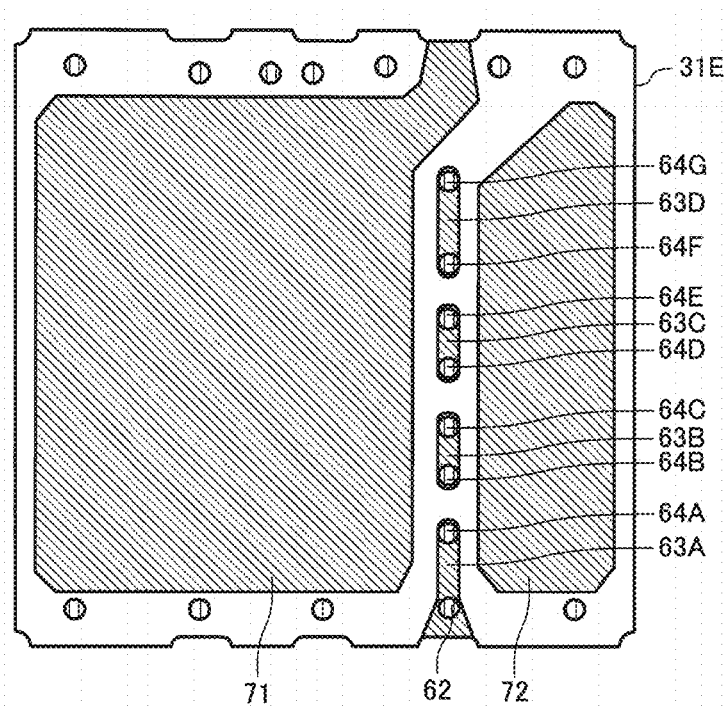
FIGS. 10A and 10B are views illustrating an example of an interconnection pattern in the third embodiment.
Figure 10B:
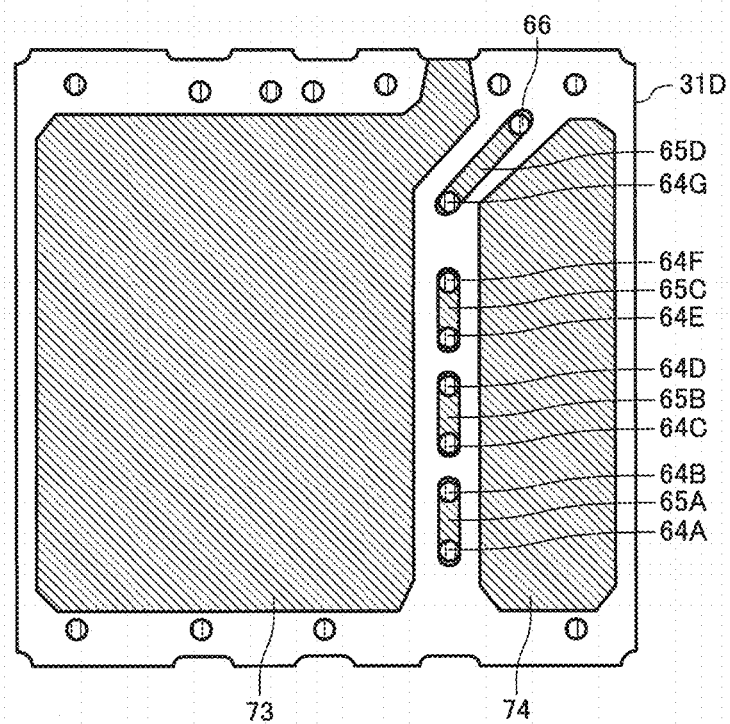

FIG. 10A is a view illustrating an example of the interconnection patterns 63A to 63D (an example of a third interconnection pattern) that are formed on the upper surface of the ceramic substrate 31E (an example of a second layer) (between the ceramic substrate 31E and the ceramic substrate 31D), and FIG. 10B is a view illustrating the interconnection patterns 65A to 65D (an example of a fourth interconnection pattern) that are formed on the upper surface of the ceramic substrate 31D (an example of a first layer) (on a side opposite to the interconnection patterns 63A to 63D in the ceramic substrate 31D). As shown in FIGS. 10A and 10B, all of the interconnection patterns 63A to 63D and 65A to 65D in the third embodiment are formed in a linear shape, and the length of the interconnection pattern (an example of the first interconnection pattern) including the interconnection patterns 63A to 63D, the vias 64A to 64G, and the interconnection patterns 65A to 65D is longer than the distance between the bottom surface (one surface) and the upper surface (the other surface) of the ceramic package 30, that is, the thickness of the ceramic package 30 (for example, approximately 1 mm). Accordingly, the second conductor pattern including the interconnection pattern constituted by the interconnection patterns 63A to 63D, the vias 64A to 64G, and the interconnection patterns 65A to 65D is longer than an internal conductor pattern (the length thereof is approximately equal to the thickness of a ceramic substrate) that is formed with the shortest route from an external conductor pattern (in a linear shape on an upper side) similar to the related art, and has a length that is at least approximately two or more times the length of the internal conductor pattern. Therefore, a resistance value of the second conductor pattern is set to approximately two or more times a resistance value of the internal conductor pattern in the related art. In addition, it is preferable that the sum of the length of interconnection patterns 63A to 63D and 65A to 65D is at least longer than a half of the length (for example, approximately 5 mm) of one side of the surface of the ceramic substrate 31E to increase the resistance value of the second conductor pattern.

In addition, as is the case with the first embodiment, the interconnection patterns 63A to 63D in the third embodiment are interposed between the interconnection pattern 71 and the interconnection pattern 72 which are parts of the third conductor pattern and have a constant potential. In addition, the interconnection patterns 65A to 65D in the third embodiment are interposed between the interconnection pattern 73 and the interconnection pattern 74 which are parts of the third conductor pattern. Accordingly, the periphery of the interconnection patterns 63A to 63D and 65A to 65D has low impedance, and thus noise overlapping is less likely to occur in the interconnection patterns 63A to 63D and 65A to 65D.

In addition, the other configurations of the physical quantity sensor 1 of the third embodiment are the same as those of the first embodiment, and thus a description thereof will not be repeated.

As described above, according to the physical quantity sensor of the third embodiment, since a part of at least one internal conductor pattern (second conductor pattern) that is connected to the external terminal is a conductor pattern having a meandering shape (zigzag shape) when viewed in a direction parallel with the bottom surface of the ceramic package 30 due to a plurality of the interconnection patterns that are interconnected in a plurality of the layers of the ceramic package 30 and a plurality of the vias that connect the plurality of interconnection patterns, it is possible to increase noise resistance. In addition, even in a case where an external circuit is connected, occurrence of ringing is suppressed and communication failure or malfunction is less, and thus it is possible to realize high reliability. In addition, it is possible to reduce noise emission from the viewpoint of electromagnetic compatibility (EMC), and thus an effect on other apparatuses or an apparatus itself can be made to be small. In addition, it is possible to obtain resistance to a certain degree at which malfunction does not occur with respect to strong electromagnetic wave noise from the outside.

In addition, according to the physical quantity sensor of the third embodiment, the length of the second conductor pattern can be made to be longer in comparison to the first embodiment, and thus a resistance value of the second conductor pattern further increases. Accordingly, with regard to the above-described effects, higher effects in comparison to the first embodiment may be expected.

In addition, according to the physical quantity sensor of the third embodiment, since the inner-layer interconnection of the ceramic package 30 is used, it is possible to realize an interconnection pattern at the low cost without using an external mounting component while not increasing a mounting area.

1-4. Fourth Embodiment

A physical quantity sensor of a fourth embodiment is different from the physical quantity sensor of the second embodiment in that the second conductor pattern includes a plurality of interconnection patterns that are formed on the surface of a plurality of layers and a plurality of vias that electrically connect the plurality of interconnection patterns instead of the interconnection pattern 63.

Figure 11:
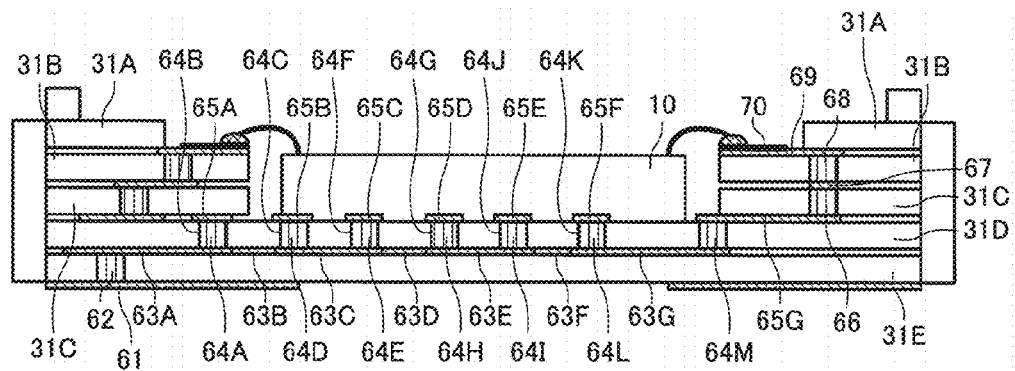
FIG. 11 is a view illustrating a longitudinal structure of a ceramic package in a fourth embodiment.

FIG. 11 is a view illustrating a longitudinal structure of a ceramic package 30 in the fourth embodiment. As shown in FIG. 11, in the fourth embodiment, an interconnection pattern 61 that is formed on a lower surface (bottom surface of the ceramic package 30) of a ceramic substrate 31E is electrically connected to an interconnection pattern 63A that is formed on an upper surface of a ceramic substrate 31E through a via 62. The interconnection pattern 63A is electrically connected to an interconnection pattern 65A that is formed on an upper surface of a ceramic substrate 31D through a via 64A. The interconnection pattern 65A is electrically connected to an interconnection pattern 63B that is formed on the upper surface of the ceramic substrate 31E through a via 64B. The interconnection pattern 63B is electrically connected to an interconnection pattern 65B that is formed on the upper surface of the ceramic substrate 31D through a via 64C. The interconnection pattern 65B is electrically connected to an interconnection pattern 63C that is formed on the upper surface of the ceramic substrate 31E through a via 64D. The interconnection pattern 63C is electrically connected to an interconnection pattern 65C that is formed on the upper surface of the ceramic substrate 31D through a via 64E. The interconnection pattern 65C is electrically connected to an interconnection pattern 63D that is formed on the upper surface of the ceramic substrate 31E through a via 64F. The interconnection pattern 63D is electrically connected to an interconnection pattern 65D that is formed on the upper surface of the ceramic substrate 31D through a via 64G. The interconnection pattern 65D is electrically connected to an interconnection pattern 63E that is formed on the upper surface of the ceramic substrate 31E through a via 64H. The interconnection pattern 63E is electrically connected to an interconnection pattern 65E that is formed on the upper surface of the ceramic substrate 31D through a via 64I. The interconnection pattern 65E is electrically connected to an interconnection pattern 63F that is formed on the upper surface of the ceramic substrate 31E through a via 64J. The interconnection pattern 63F is electrically connected to an interconnection pattern 65F that is formed on the upper surface of the ceramic substrate 31D through a via 64K. The interconnection pattern 65F is electrically connected to an interconnection pattern 63G that is formed on the upper surface of the ceramic substrate 31E through a via 64L. The interconnection pattern 63G is electrically connected to an interconnection pattern 65G that is formed on the upper surface of the ceramic substrate 31D through a via 64M. The interconnection pattern 65G is electrically connected to an interconnection pattern 67 that is formed on an upper surface of a ceramic substrate 31C through a via 66. The interconnection pattern 67 is electrically connected to an interconnection pattern 69 that is formed on an upper surface of a ceramic substrate 31B through a via 68. A metallized region 70 is provided on apart of an upper surface of the interconnection pattern 69, and the metallized region 70 is wire-bonded to the terminal (electrode) of the integrated circuit (IC) 10.

That is, the interconnection pattern 61 (first conductor pattern), which is an external conductor pattern, is electrically connected to the integrated circuit (IC) 10 through an internal conductor pattern (second conductor pattern) that is constituted by the via 62, the interconnection patterns 63A to 63G, the vias 64A to 64M, the interconnection patterns 65A to 65G, the via 66, the interconnection pattern 67, the via 68, the interconnection pattern 69, and the metallized region 70.

Figure 12A:
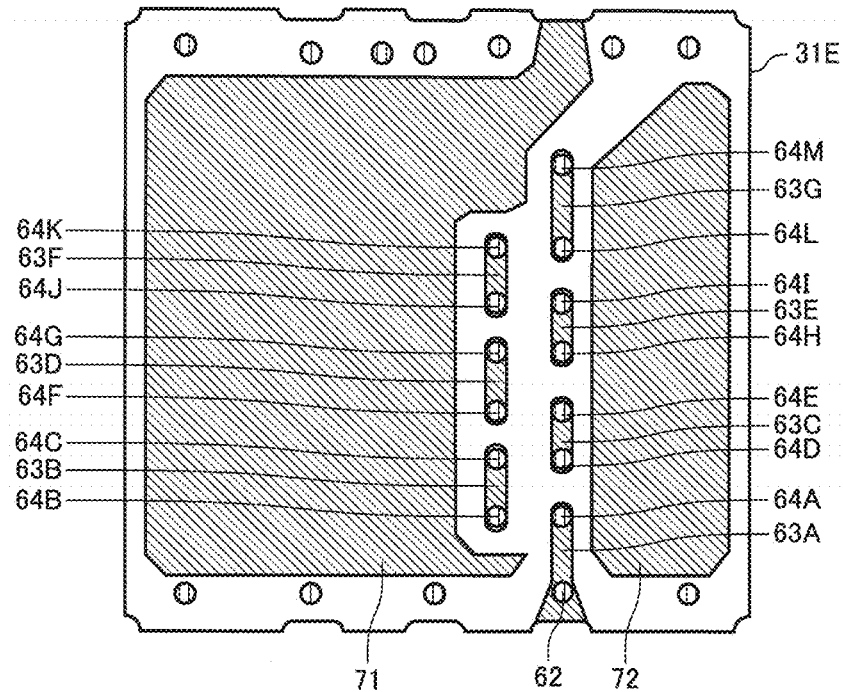
FIGS. 12A and 12B are views illustrating an example of an interconnection pattern in the fourth embodiment.
Figure 12B:
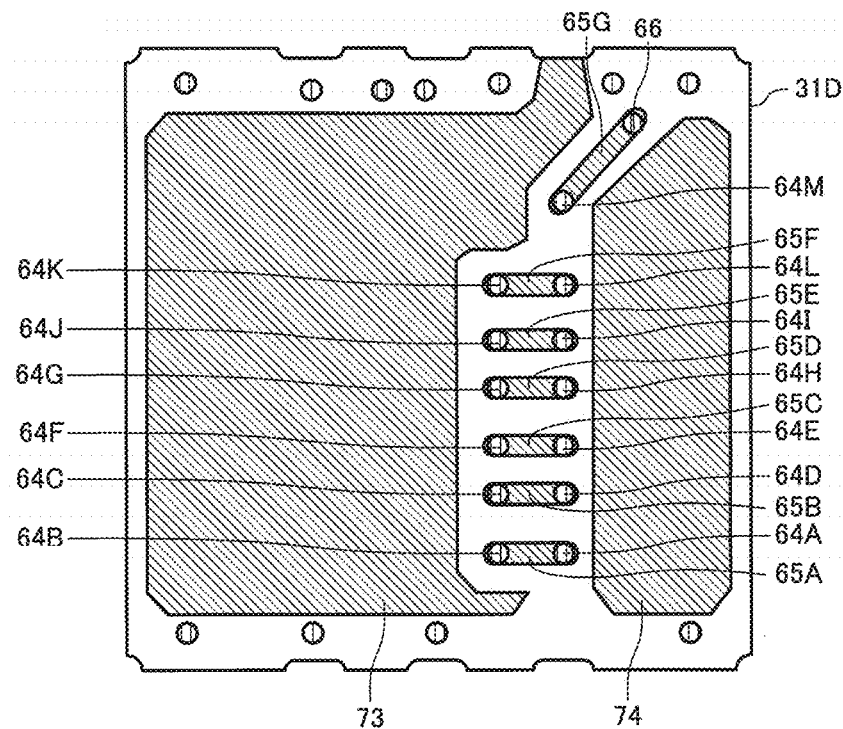

FIG. 12A is a view illustrating an example of the interconnection patterns 63A to 63G (an example of the third interconnection pattern) that are formed on the upper surface of the ceramic substrate 31E (an example of the second layer) (between the ceramic substrate 31E and the ceramic substrate 31D), and FIG. 12B is a view illustrating an example of the interconnection patterns 65A to 65G (an example of the fourth interconnection pattern) that are formed on the upper surface of the ceramic substrate 31D (an example of the first layer) (on a side opposite to the interconnection patterns 63A to 63D in the ceramic substrate 31D). As shown in FIGS. 12A and 12B, all of the interconnection patterns 63A to 63G and 65A to 65G in the fourth embodiment are formed in a linear shape, and the length of the interconnection pattern (an example of the first interconnection pattern) including the interconnection patterns 63A to 63G, the vias 64A to 64M, and the interconnection patterns 65A to 65G is longer than the distance between the bottom surface (one surface) and the upper surface (the other surface) of the ceramic package 30, that is, the thickness of the ceramic package 30 (for example, approximately 1 mm). Accordingly, the second conductor pattern including the interconnection pattern constituted by the interconnection patterns 63A to 63G, the vias 64A to 64M, and the interconnection patterns 65A to 65G is longer than an internal conductor pattern (the length thereof is approximately equal to the thickness of a ceramic substrate) that is formed with the shortest route from an external conductor pattern (in a linear shape on an upper side) similar to the related art, and has a length that is at least approximately two or more times the length of the internal conductor pattern. Therefore, a resistance value of the second conductor pattern is set to approximately two or more times a resistance value of the internal conductor pattern in the related art. In addition, it is preferable that the sum of the length of interconnection patterns 63A to 63G and 65A to 65G is at least longer than a half of the length (for example, approximately 5 mm) of one side of the surface of the ceramic substrate 31E to increase the resistance value of the second conductor pattern.

In addition, as is the case with the second embodiment, the interconnection patterns 63A to 63G in the fourth embodiment are interposed between the interconnection pattern 71 and the interconnection pattern 72 which are parts of the third conductor pattern and have a constant potential. In addition, the interconnection patterns 65A to 65G in the fourth embodiment are interposed between the interconnection pattern 73 and the interconnection pattern 74 which are parts of the third conductor pattern. Accordingly, the periphery of the interconnection patterns 63A to 63G and 65A to 65G has low impedance, and thus noise overlapping is less likely to occur in the interconnection patterns 63A to 63G and 65A to 65G.

Figure 13:
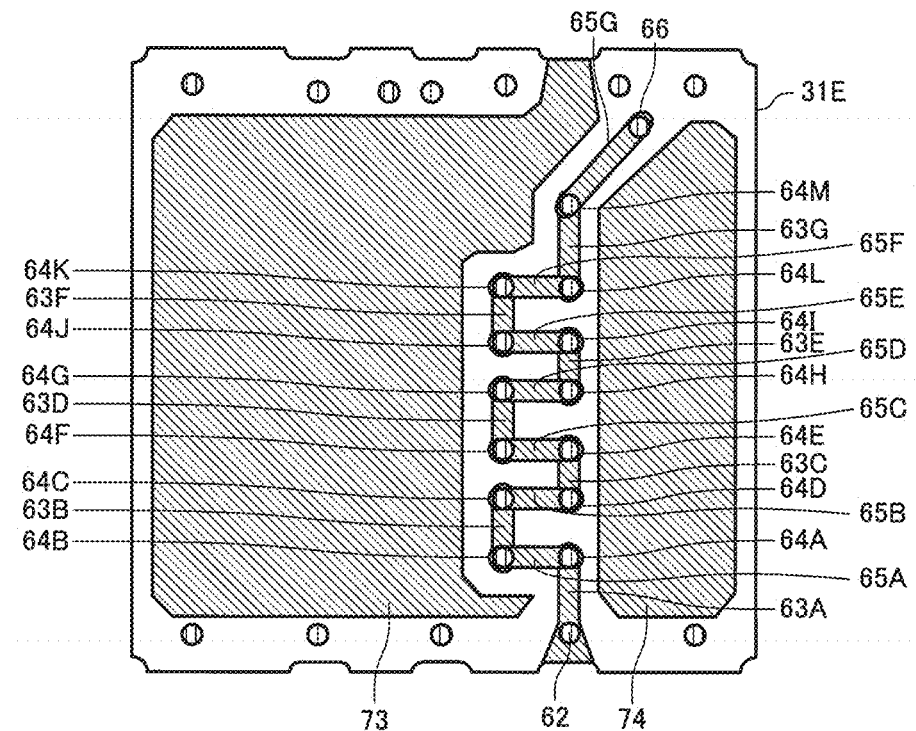
FIG. 13 is a view obtained by superimposing FIG. 12B on FIG. 12A.

In addition, as shown in FIG. 13 that is a view obtained by superimposing FIG. 12B on FIG. 12A, in the third embodiment, at least a part of the second conductor pattern is formed in a meandering shape in a plan view of the ceramic package 30 (when viewed in a direction perpendicular to the bottom surface).

In addition, the other configurations of the physical quantity sensor 1 of the fourth embodiment are the same as those of the second embodiment, and thus a description thereof will not be repeated.

As described above, according to the physical quantity sensor of the fourth embodiment, since a part of at least one internal conductor pattern (second conductor pattern) that is connected to the external terminal is a conductor pattern having a meandering shape (zigzag shape) when viewed in a direction perpendicular to the bottom surface of the ceramic package 30 due to a plurality of the interconnection patterns that are interconnected in a plurality of the layers of the ceramic package 30 and a plurality of the vias that connect the plurality of interconnection patterns, it is possible to increase noise resistance. In addition, even in a case where an external circuit is connected, occurrence of ringing is suppressed and communication failure or malfunction is less, and thus it is possible to realize high reliability. In addition, it is possible to reduce noise emission from the viewpoint of electromagnetic compatibility (EMC), and thus an effect on other apparatuses or an apparatus itself can be made to be small. In addition, it is possible to obtain resistance to a certain degree at which malfunction does not occur with respect to strong electromagnetic wave noise from the outside.

In addition, according to the physical quantity sensor of the fourth embodiment, the length of the second conductor pattern can be made to be longer in comparison to the second embodiment, and thus a resistance value of the second conductor pattern further increases. Accordingly, with regard to the above-described effects, higher effects in comparison to the second embodiment may be expected.

In addition, in the physical quantity sensor of the fourth embodiment, in a case of using the second conductor pattern in a communication line, as a communication frequency becomes higher, the interconnection patterns 63A to 63G and 65A to 65G operate as an inductance. In addition, an equivalent circuit configuration of a low-pass filter of L and C is structurally completed by the inductance, an electrostatic capacitance that is formed between the interconnection patterns 63A to 63G and the interconnection patterns 71 and 72 which have a constant potential, and an electrostatic capacitance that is formed between the interconnection patterns 65A to 65G and the interconnection patterns 73 and 74 which have a constant potential, and thus there is an effect of removing a high-frequency noise. When the communication frequency becomes higher, the effect of the low-pass filter can be exhibited in a more significant manner.

In addition, according to the physical quantity sensor of the fourth embodiment, since the inner-layer interconnection of the ceramic package 30 is used, it is possible to realize an interconnection pattern at the low cost without using an external mounting component while not increasing a mounting area.

1-5. Fifth Embodiment

A physical quantity sensor of a fifth embodiment is different from the physical quantity sensors of the first to fourth embodiments in that a part of the second conductor pattern is constituted by a material having a sheet resistance value higher than that of the first conductor pattern. Here, the sheet resistance value $R'=\rho/d$ [$\Omega/\square$]. $\rho$ represents a resistivity of the conductor pattern, and d represents the thickness of the conductor pattern. In the following description, as a specific example of the physical quantity sensor of the fifth embodiment, an example that is modified from the first embodiment is exemplified, but other embodiments may be modified.

Figure 14:
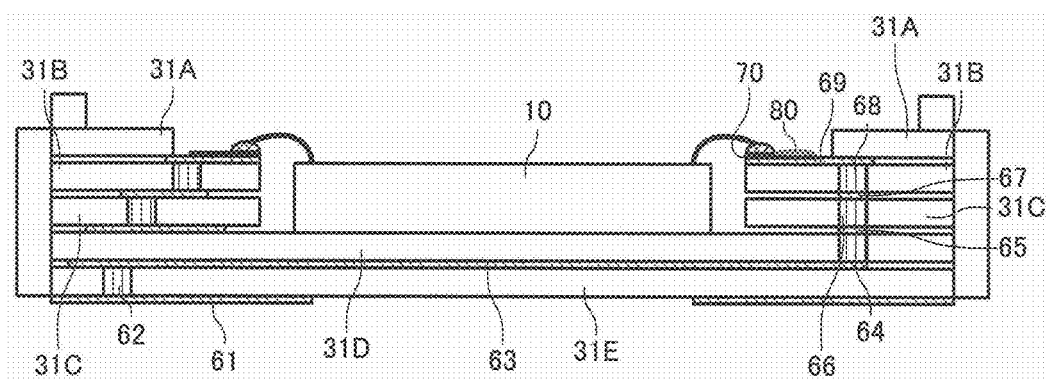
FIG. 14 is a view illustrating a longitudinal structure of a ceramic package in a fifth embodiment.
Figure 15:
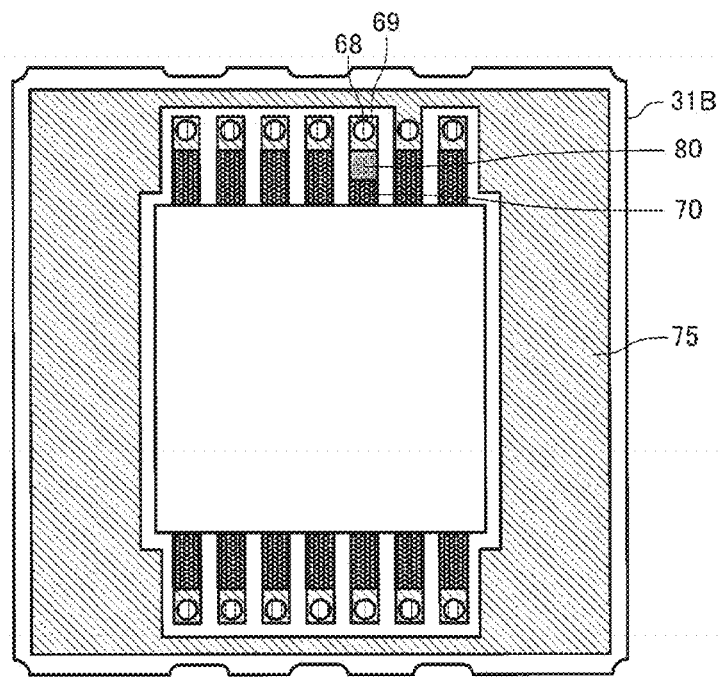
FIG. 15 is a view illustrating an example of an interconnection pattern in the fifth embodiment.

FIG. 14 is a view illustrating a longitudinal structure of a ceramic package 30 in a fifth embodiment. In addition, FIG. 15 is a view illustrating an example of an interconnection pattern that is formed on the upper surface of the ceramic substrate 31B. As shown in FIG. 14, in the fifth embodiment, the configuration of interconnection patterns 61, 63, 65, 67, and 69, vias 62, 64, 66, and 68, and a metallized region 70 is the same as the first embodiment. In addition, in the fifth embodiment, as shown in FIGS. 14 and 15, a high-resistance material 80 having a sheet resistance value higher than that of the interconnection pattern 61 (first conductor pattern) is applied to apart of the metallized region 70. As the high-resistance material 80, for example, a high-resistance material, which is obtained by using a resistor paste such as ruthenium dioxide ($RuO_2$) as a ruthenium (Ru))-based oxide, may be used.

That is, the interconnection pattern 61 (first conductor pattern), which is an external conductor pattern, is electrically connected to the integrated circuit (IC) 10 through an internal conductor pattern (second conductor pattern) that is constituted by the via 62, the interconnection patterns 63A to 63D, the vias 64A to 64G, the interconnection patterns 65A to 65D, the via 66, the interconnection pattern 67, the via 68, the interconnection pattern 69, the metallized region 70, and the high-resistance material 80.

In addition, as shown in FIG. 15, a low-impedance interconnection pattern 75, which is a part of the conductor pattern having a constant potential (ground potential), is formed on most of the upper surface of the ceramic substrate 31B, and thus noise overlapping is less likely to occur in the interconnection pattern 69.

In addition, the other configurations of the physical quantity sensor 1 of the fifth embodiment are the same as those of the first embodiment, and thus a description thereof will not be repeated.

As described above, according to the physical quantity sensor of the fifth embodiment, since at least one internal conductor pattern (second conductor pattern), which is connected to an external terminal, has an interconnection pattern which is formed on a surface of at least one layer of the ceramic package 30 and is longer than the thickness of the ceramic package 30, and a part of the second conductor pattern is constituted by a material having a sheet resistance value higher than that of the first conductor pattern, it is possible to increase noise resistance. In addition, even in a case where an external circuit is connected, occurrence of ringing is suppressed and communication failure or malfunction is less, and thus it is possible to realize high reliability. In addition, it is possible to reduce noise emission from the viewpoint of electromagnetic compatibility (EMC), and thus an effect on other apparatuses or an apparatus itself can be made to be small. In addition, it is possible to obtain resistance to a certain degree at which malfunction does not occur with respect to strong electromagnetic wave noise from the outside.

In addition, according to the physical quantity sensor of the fifth embodiment, the high-resistance material 80 is provided, and thus the resistance value of the second conductor pattern can be made to be higher in comparison to the first embodiment. Accordingly, with regard to the above-described effects, higher effects in comparison to the first embodiment may be expected.

In addition, according to the physical quantity sensor of the fifth embodiment, since the inner-layer interconnection of the ceramic package 30 is used, it is possible to realize an interconnection pattern at the low cost without using an external mounting component while not increasing a mounting area.

2. Electronic Apparatus

Figure 16:
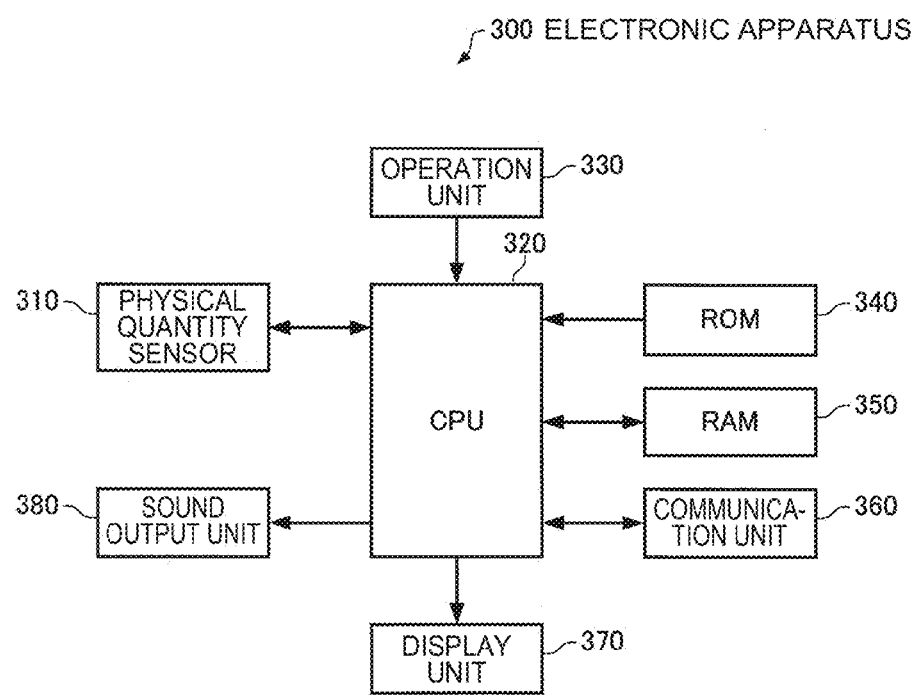
FIG. 16 is a functional block diagram of an electronic apparatus of this embodiment.
Figure 17:
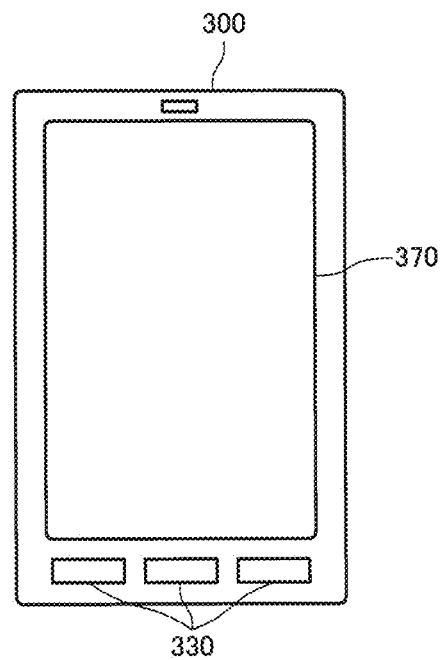
FIG. 17 is a view illustrating an example of an external appearance of the electronic apparatus of this embodiment.

FIG. 16 is a functional block diagram of an electronic apparatus of this embodiment. In addition, FIG. 17 is a view illustrating an example of an external appearance of a smart phone that is an example of the electronic apparatus of this embodiment.

The electronic apparatus 300 of this embodiment includes a physical quantity sensor 310, a central processing unit (CPU) 320, an operation unit 330, a read only memory (ROM) 340, a random access memory (RAM) 350, a communication unit 360, a display unit 370, and a sound output unit 380. In addition, the electronic apparatus of this embodiment may have a configuration in which parts of constituent elements (respective portions) in FIG. 16 are omitted or modified, or other constituent elements are added.

The physical quantity sensor 310 is a device that detects a physical quantity, and outputs a signal (physical quantity signal) in a level according to a physical quantity that is detected. For example, the physical quantity sensor 310 may be an inertial sensor that detects at least a part of a physical quantity such as acceleration, an angular velocity, and a speed, or may be an inclinometer that measures an inclination angle. As the physical quantity sensor 310, for example, the physical quantity sensor 1 of the respective embodiments is applicable.

The CPU 320 performs various calculation processes or control process by using the physical quantity signal that is output from the physical quantity sensor 310 according to a program that is stored in the ROM 340 and the like. In addition, the CPU 320 performs various processes according to operation signals transmitted from the operation unit 330, a process of controlling the communication unit 360 to conduct data communication with the outside, a process of transmitting a display signal to display various kinds of information on the display unit 370, a process of outputting various kinds of sound to the sound output unit 380, and the like.

The operation unit 330 is an input device that is constituted by an operation key, a button switch, and the like, and outputs an operation signal according to operation by a user to the CPU 320.

The ROM 340 stores a program to allow the CPU 320 to perform various calculation processes or control processes, data, and the like.

The RAM 350 is used as a work region of the CPU 320, and temporarily stores a program or data that is read out from the ROM 340, data that is input from the operation unit 330, a result of operation that is performed by the CPU 320 according to various programs, and the like.

The communication unit 360 performs various kinds of control to establish data communication between the CPU 320 and an external device.

The display unit 370 is a display device that is constituted by a liquid crystal display (LCD) or an organic EL display, and the like, and displays various kinds of information on the basis of a display signal that is input from the CPU 320. The display unit 370 may be provided with a touch panel that functions as the operation unit 330.

The sound output unit 380 is a device such as a speaker that outputs sound.

When being equipped with the above-described physical quantity sensor 1 of this embodiment as the physical quantity sensor 310, it is possible to realize an electronic apparatus with higher reliability.

As the electronic apparatus 300, various electronic apparatuses may be considered, and examples thereof include a personal computer (for example, a mobile type personal computer, a laptop type personal computer, a note type personal computer, a tablet type personal computer), a mobile terminal such as a portable phone, a digital still camera, an ink jet type ejection device (for example, an ink jet printer), a storage area network device such as a router and a switch, a local area network apparatus, a television, a video camera, a video tape recorder, a car navigation device, a pager, an electronic organizer (also including one equipped with a communication function), an electronic dictionary, a calculator, an electronic gaming machine, a controller for game, a word processor, a workstation, a videophone, a security television monitor, electronic binoculars, a POS terminal, a medical apparatus (for example, an electronic thermometer, a blood pressure meter, a blood glucose meter, an electrocardiogram measurement device, an ultrasonic diagnostic apparatus, and an electronic endoscope), a fish finder, various measurement apparatuses, meters (for example, meters of a vehicle, an aircraft, and a ship), a flight simulator, a head-mounted display, a motion tracer, a motion tracking device, a motion controller, a pedestrian dead reckoning (PDR) device, and the like.

3. Moving object

Figure 18:
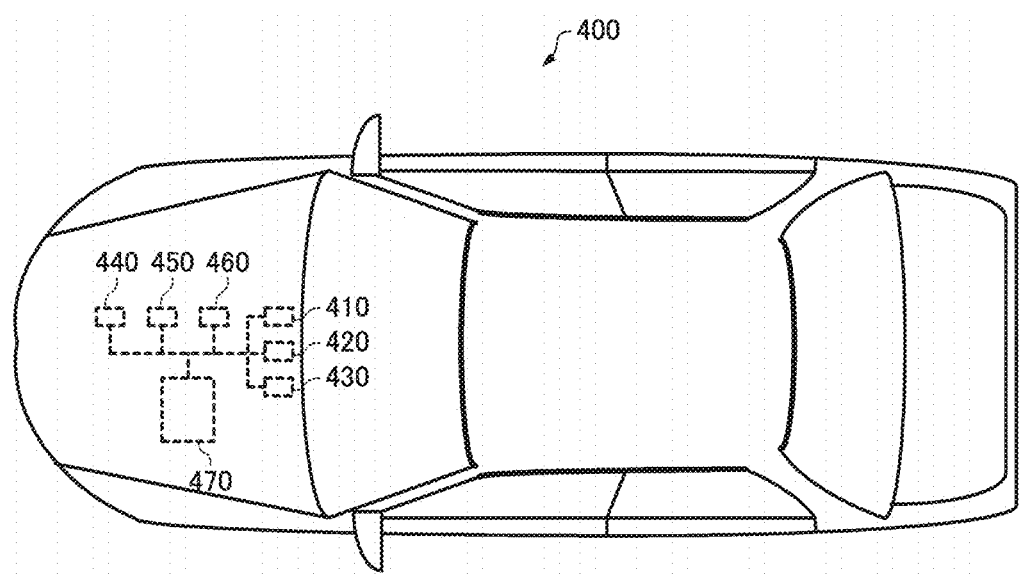
FIG. 18 is a view illustrating an example of a moving object of this embodiment.

FIG. 18 is a view (top view) illustrating an example of a moving object of this embodiment. A moving object 400 shown in FIG. 18 includes physical quantity sensors 410, 420, and 430, controllers 440, 450, and 460, and a battery 470. In addition, the moving object of this embodiment may have a configuration in which parts of constituent elements (respective portions) in FIG. 18 are omitted or modified, or other constituent elements are added.

The physical quantity sensors 410, 420, and 430, and the controllers 440, 450, and 460 operate using a power supply voltage supplied from the battery 470.

The physical quantity sensors 410, 420, and 430 are devices that detect a physical quantity, and output a signal (physical quantity signal) in a level according to a physical quantity that is detected, and examples thereof include an angular velocity sensor, an acceleration sensor, a speed sensor, an inclinometer, and the like.

The controllers 440, 450, and 460 perform various kinds of control for an attitude control system, a roll-over prevention system, a brake system, and the like by using apart or the entirety of physical quantity signals that are output from the physical quantity sensors 410, 420, and 430, respectively.

As the physical quantity sensors 410, 420, and 430, the above-described physical quantity sensor 1 of the respective embodiments is applicable, thereby securing higher reliability.

As the moving object 400, various moving objects can be considered, and examples thereof include a vehicle (also including an electric vehicle), an aircraft such as a jet aircraft and a helicopter, a ship, a rocket, a satellite, and the like.

4. Modification Example

The invention is not limited to the embodiments, and various modification can be made in a range without departing from the gist of the invention.

For example, in all of the above-described embodiments, although a part of the second conductor pattern is configured to have a linear shape (approximately linear shape) or a meandering shape when viewed in a direction that is perpendicular to or parallel with the bottom surface of the ceramic package 30, a shape such as an L-shape and a step shape other than the linear shape (approximately linear shape) or the meandering shape is also possible.

The above-described embodiments and modification example are illustrative only, and the invention is not limited thereto. For example, the respective embodiments and the modification example may be combined in an appropriate manner.

The invention includes substantially the same configuration (for example, a configuration in which a function, a method, and a result are the same, or a configuration in which an object and an effect are the same) as the configuration described in the embodiments. In addition, the invention includes a configuration in which substitution is made to portions that are not essential in the configuration described in the embodiments. In addition, the invention includes a configuration capable of exhibiting the same operational effect as the configuration described in the embodiments or a configuration capable of achieving the same object. In addition, the invention includes a configuration in which a known technology is added to the configuration described in the embodiments.

The entire disclosure of Japanese Patent Application No. 2013-090231, filed Apr. 23, 2013 is expressly incorporated by reference herein.

What is claimed is:

1. A physical quantity sensor comprising:
   a sensor element;
   an integrated circuit that is electrically connected to the sensor element; and
   a base body including a plurality of substrates on which the integrated circuit is mounted, the plurality of substrates including a first substrate and a second substrate, and the first substrate and the second substrate being adjacent to one another,
   wherein a first conductor pattern for electrical connection with the outside is disposed on one surface of the base body,
   a second conductor pattern is disposed to be electrically connected to the first conductor pattern and the integrated circuit,
   the second conductor pattern includes a first interconnection pattern that is disposed inside the base body between the first and second substrates, the first interconnection pattern being electrically connected between the integrated circuit and the first conductor pattern, and a second interconnection pattern that is disposed on the other surface of the base body, and
   the first interconnection pattern is longer than a distance between the one surface and the other surface,
   the integrated circuit includes a terminal for serial communication or power supply voltage,
   the second conductor pattern is electrically connected to the terminal, and
   at least a part of the second conductor pattern is constituted by a material having a sheet resistance value higher than a sheet resistance value of the first conductor pattern.

2. The physical quantity sensor according to claim 1, wherein in a plan view of the base body, the first interconnection pattern extends at least from the one end side of the integrated circuit to the other end side.

3. The physical quantity sensor according to claim 1, wherein the first interconnection pattern includes a linear shape.

4. The physical quantity sensor according to claim 1, wherein at least a part of the first interconnection pattern has a meandering shape.

5. The physical quantity sensor according to claim 1, wherein the first interconnection pattern includes
   a plurality of third interconnection patterns that are provided between the first substrate and the second substrate,
   a plurality of fourth interconnection patterns which are disposed at the first substrate and which are provided on a side opposite to the plurality of third interconnection patterns in the first substrate, and
   a plurality of vias that electrically connect the plurality of third interconnection patterns and the plurality of fourth interconnection patterns, respectively, and
   the first interconnection pattern includes a meandering shape in a side view of the base body.

6. The physical quantity sensor according to claim 1, wherein the first interconnection pattern includes
   a plurality of third interconnection patterns that are provided between the first substrate and the second substrate,
   a plurality of fourth interconnection patterns which are disposed at the first substrate and which are provided on a side opposite to the plurality of third interconnection patterns in the first substrate, and
   a plurality of vias that electrically connect the plurality of third interconnection patterns and the plurality of fourth interconnection patterns, respectively, and
   the first interconnection pattern includes a meandering shape in a plan view of the base body.

7. The physical quantity sensor according to claim 1, wherein a third conductor pattern having a constant potential is provided inside the base body, and
   the third conductor pattern is provided at least at both sides of the first interconnection pattern.

8. An electronic apparatus comprising:
   the physical quantity sensor according to claim 1.

9. A moving object comprising:
   the physical quantity sensor according to claim 1.

10. The physical quantity sensor according to claim 1, wherein the first interconnection pattern includes an fifth interconnection pattern that is provided between the first substrate and the second substrate,
    the fifth interconnection pattern is longer than a distance between the one surface and the other surface.

11. An electronic apparatus comprising:
    the physical quantity sensor according to claim 2.

12. A moving object comprising:
    the physical quantity sensor according to claim 2.

* * * * *